United States Patent
Davis et al.

(10) Patent No.: US 7,231,573 B2
(45) Date of Patent: Jun. 12, 2007

(54) DELAY MANAGEMENT SYSTEM

(75) Inventors: Alan Howard Davis, Sunnyvale, CA (US); John Freeseman, Ft. Collins, CO (US)

(73) Assignee: Verigy Pte. Ltd., Singapore (SG)

( * ) Notice: Subject to any disclaimer, the term of this patent is extended or adjusted under 35 U.S.C. 154(b) by 421 days.

(21) Appl. No.: 10/327,386

(22) Filed: Dec. 20, 2002

(65) Prior Publication Data

US 2004/0153890 A1    Aug. 5, 2004

(51) Int. Cl.
G01R 31/3181    (2006.01)
G01R 31/40      (2006.01)

(52) U.S. Cl. ................................ 714/744; 714/699

(58) Field of Classification Search ............ 714/699, 714/700, 55, 742, 744, 798, 815; 375/213, 375/224, 375; 716/6
See application file for complete search history.

(56) References Cited

U.S. PATENT DOCUMENTS

| | | | |
|---|---|---|---|
| 3,868,678 A * | 2/1975 | Michael ..................... 341/162 |
| 4,000,460 A | 12/1976 | Kadakia et al. |
| 4,517,512 A | 5/1985 | Petrich et al. |
| 4,637,020 A | 1/1987 | Schinabeck |
| 4,646,299 A | 2/1987 | Schinabeck et al. |
| 4,686,628 A | 8/1987 | Lee et al. |
| 4,841,388 A * | 6/1989 | Hori .......................... 360/72.1 |
| 4,937,780 A * | 6/1990 | Geyer et al. ................ 713/502 |
| 5,535,256 A * | 7/1996 | Maloney et al. ............ 379/309 |
| 5,652,524 A | 7/1997 | Jennion et al. |
| 5,721,495 A | 2/1998 | Jennion et al. |
| 5,768,627 A * | 6/1998 | Jones et al. .................... 710/60 |
| 5,825,658 A * | 10/1998 | Ginetti et al. .................. 716/6 |
| 5,844,906 A * | 12/1998 | Khelghatti et al. ......... 370/474 |
| 6,058,389 A * | 5/2000 | Chandra et al. ............... 707/1 |
| 6,144,713 A * | 11/2000 | Eto ............................. 375/375 |
| 6,388,518 B1 * | 5/2002 | Miyatani ..................... 330/149 |
| 2002/0152459 A1 * | 10/2002 | Bates et al. ..................... 725/9 |

* cited by examiner

*Primary Examiner*—Albert Decady
*Assistant Examiner*—Dipakkumar Gandhi

(57) ABSTRACT

A delay management system in a computer system includes a delay manager and a first storage element that stores a delay time. The delay manager is configured to receive a series of delay values and respond to each delay value in the series of delay values by providing a corresponding delay time value. The delay time is updated to the corresponding delay time value if the corresponding delay time value is greater than the delay time.

20 Claims, 10 Drawing Sheets

DELAY MANAGEMENT SYSTEM

THE FIELD OF THE INVENTION

The present invention generally relates to computer systems, and more particularly, to a delay management system operating in a computer system.

BACKGROUND OF THE INVENTION

Some types of conventional computer systems are used to manage hardware resources to perform particular tasks. Example hardware resources include stimulus resources and measurement resources. Stimulus resources apply stimuli to one or more devices. For example, a stimulus resource can apply a voltage or a current to a device, such as a circuit, switch or relay. In turn, the device can direct a voltage or a current to a particular site, or direct pneumatic or hydraulic fluid to move mechanical arms. Measurement resources sense or measure a response from a device. For example, a measurement resource can include a sensing circuit that provides precise voltage or current measurement values, or bits of information that indicate the location of an arm.

Generally, the computer system sets stimulus resource values prior to calling a measurement resource. Often, the computer system must delay performing the measurement operation while waiting for the stimulus to settle to a stable value or state. This delay time is referred to as a settling time delay. Multiple stimulus resources introduce multiple delay values that must be managed to optimize the time it takes to perform a particular task or series of tasks.

In one type of computer system, referred to as a circuit test system, stimulus resources apply stimuli to an integrated circuit and measurement resources measure the circuit's response. Stimulus resources provide stimuli in the form of logic levels or analog voltages and currents. Measurement resources take measurements of logic levels, analog voltages and currents, and timing values.

Circuit test systems perform tests on a circuit, referred to as a device under test (DUT). Example types of tests performed by a circuit test system include DC parametric tests, functional tests, and AC propagation delay tests. Parametric tests check DC voltage and current handling characteristics of inputs and outputs. Functional tests check DUT functionality using test vectors, which preferably exercise all functional aspects of the DUT. Propagation delay tests check the time it takes for a signal to propagate through the DUT, referred to as the AC characteristics. Often, each test type is performed multiple times under different conditions. Hardware resources are typically changed for each test.

A user, such as a test engineer, typically supplies a test program to test a DUT in a particular test sequence. The test program includes instructions that change hardware resources to accomplish testing. This test program is loaded onto the test system and executed to alter hardware resources and test a DUT. In one example sequence, the test program first supplies instructions to power the DUT at a selected source voltage. Source current is measured and checked against limits to detect shorts and opens on the power line. After a DUT has passed this test, DC parametric tests are performed to check the integrity of each input and output. The DC parametric tests are performed by applying selected voltages and currents to particular input and output pins. Test vectors are often employed to obtain proper testing states at the output pins. The test system measures current and voltage values from selected pins.

After DC parametric tests, functional tests are performed. Functional tests can include stepping through a set of test vectors where selected logic levels are applied to input pins, and output pins are checked against expected logic states. A functional test can be performed multiple times with different voltages on the power pin. Next, propagation delay tests are performed to ensure the DUT operates up to speed. Often, when hardware resources are altered, the test system must wait for the voltage or current to settle before taking a measurement. Waiting for the voltage or current to settle helps to ensure an accurate measurement, but increases test time and raises device cost.

Test engineers write test programs to optimize the balance between testing accuracy and speed. Test system manufacturers publish tables of hardware resource settling time delay values. These settling time delay values are usually worst case settling times for hardware resources. In one optimization method, test engineers write test programs to provide a delay after each resource change, which results in long test times. In order to reduce these test times, test engineers typically measure settling times and use measured delay values instead of published delay values. Using the measured delay values ensures accurate measurements and reduces test time.

In another method, test engineers change multiple resources before providing one delay value for all changed resource settling times. In this method, test engineers use the longest settling time for all changed resources. This settling time is taken from a published table or, to reduce test time further, the test engineer measures settling times for all changed resources and chooses the longest measured settling time. However, measuring settling times can be a time consuming and frustrating task, especially, if settling times change from one test system to another. In each of these methods, test program instructions are not executed while the resources settle. Also, the burden of optimizing the test program is placed on the test engineer.

In an effort to reduce the burden on the test engineer, test system manufacturers typically include a settling time delay at the end of each function that changes a hardware resource. However, this causes the test system to incur a settling time delay for each hardware resource change. To allow for multiple resource changes before a single delay, test system manufacturers provide test engineers with a switch to shut off the delay for a particular resource change. Using the switch, the test engineer can set one delay for a group of resource changes. However, the burden is still on the test engineer to figure out which delay or group of delays to use. Also, the test system cannot process instructions while the hardware resources settle.

For reasons stated above and for other reasons presented in the description of the preferred embodiments section of the present specification, an improved delay management system is desired that does not have the above problems associated with using published tables of settling time delay values, measuring settling times, and/or placing the optimization burden on the test engineer.

SUMMARY OF THE INVENTION

One aspect of the present invention provides a delay management system in a computer system including a delay manager and a first storage element that stores a delay time. The delay manager is configured to receive a series of delay values and respond to each delay value in the series of delay values by providing a corresponding delay time value. The delay time is updated to the corresponding delay time value if the corresponding delay time value is greater than the delay time.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
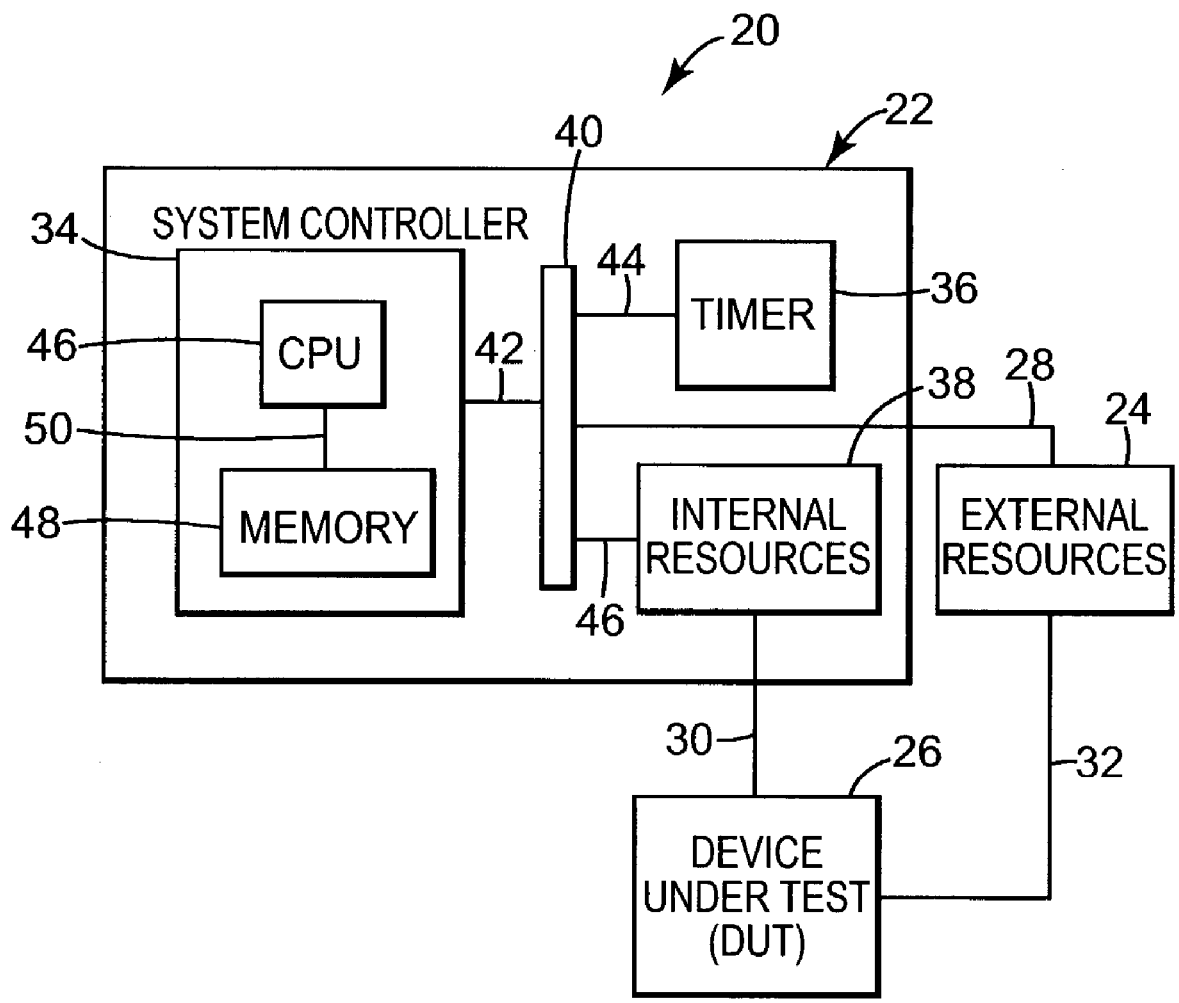
FIG. 1 is a block diagram illustrating an exemplary computer system in which exemplary embodiments of a delay management system, according to the present invention, are implemented.

FIG. 1 is a block diagram illustrating an exemplary computer system 20 in which exemplary embodiments of a delay management system according to the present invention are implemented. Computer system 20 includes a circuit test system 22, external hardware resources 24, and a platform holding a device under test (DUT), indicated at 26. Test system 22 is electrically coupled to external resources 24 through an external resource bus 28, and to DUT 26 through device bus 30. External resources 24 are electrically coupled to DUT 26 through external device bus 32.

Test system 22 manages hardware resource settling time delay values as part of testing an integrated circuit. These delay values include voltage source and current source settling time delay values. In other computer systems incorporating the present invention, delay values could be related to settling times for other resources, such as hydraulic and pneumatic switches. The delay management system of the present invention can be implemented in many different computer system applications.

In the present exemplary embodiment, test system 22 includes a system controller 34, a timer 36, internal hardware resources 38, and an internal bus 40. The system controller 34 is electrically coupled to timer 36 through controller bus 42, internal bus 40 and timer bus 44. Also, controller 34 is electrically coupled to internal resources 38 through controller bus 42, internal bus 40 and internal resource bus 46. In addition, controller 34 is electrically coupled to external resources 24 through controller bus 42, internal bus 40 and external resource bus 28.

In one embodiment, controller 34 manages all hardware resource delay values for internal and external resources 38 and 24. In this embodiment, timer 36 communicates only with controller 34. In another embodiment, timer 36 and controller 34 manage hardware resource delay values together. In this second embodiment, timer 36 communicates with controller 34 and also, directly with internal resources 38 and external resources 24. Timer 36 is electrically coupled to internal resources 38 through timer bus 44, internal bus 40 and internal resource bus 46, and to external resources 24 through timer bus 44, internal bus 40, and external bus 28.

Controller 34 includes a central processing unit (CPU) 46 electrically coupled to memory 48 through CPU bus 50. CPU 46 is a single microprocessor and memory 48 is random access memory (RAM). However, in other embodiments, different processing units can be used such as a mainframe processor, multiple processors or a micro-controller. Also, other memories can be used, with or without memory 48, including electrically erasable programmable read only memory (EEPROM), flash memory and hard drive storage devices.

CPU 46 executes software out of memory 48 to control operation of test system 22. At boot up, software is loaded from non-volatile memory (not shown for clarity) such as read only memory (ROM), erasable programmable read only memory (EPROM), a hard disk drive or a network server. This software includes an operating system with user interface instructions for controlling a user interface (also not shown for clarity) including a display, keyboard, mouse and floppy disk drive. A user, such as a test engineer, loads a test program into memory 48 using this interface. The test program includes application programming interface (API) instructions provided as part of the operating system to control internal resources 38 and external resources 24.

In one embodiment of the delay management system, the delay manager is software loaded into memory 48 along with the operating system at boot up. The test program uses API instructions to access the delay manager through the operating system. CPU 46 retrieves and executes instructions out of memory 48 including test program, delay manager and operating system instructions. In one example operation of the delay manager, the test program includes a series of set instructions to set internal resources 38 and external resources 24. Controller 34 executes these set instructions and retrieves delay values for the internal resources 38 from software program tables. The test program supplies delay values for the external resources 24. The delay values indicate the length of time it takes for changed hardware resources to settle. The delay manager receives this series of delay values and determines the time it takes for all set hardware resources to settle. Test system 22 delays execution of certain measurement instructions while hardware resources settle.

The delay manager responds to each received delay value in the series of delay values by retrieving a corresponding current time value from timer 36. The received delay value and corresponding current time value are summed to get a total delay time value, referred to as a delay time value. This delay time value is compared to a stored delay time. If the delay time value is larger than the stored delay time, the stored delay time is updated to the delay time value. Otherwise, the stored delay time is left unchanged. Here, larger refers to the delay time value that reaches furthest into the future.

Controller 34 is free to process other instructions from the test program and operating system after the set instructions have been executed. Processing continues until the controller 34 retrieves a measurement resource instruction that causes test system 22 to wait until the current time reaches the delay time before executing a measurement. After current time has reached the delay time, controller 34 executes the measurement instruction to control internal resources 38 and external resources 24 and take a measurement from DUT 26. Next, processing continues with the test program. In this embodiment, the delay manager is implemented in software and a current time is obtained from timer 36.

In another embodiment, timer 36 includes hardware for receiving a series of delay values and setting a delay time that is counted down to zero before certain measurements can be taken from DUT 26. CPU 46 executes test program and operating system instructions out of memory 48 to set internal resources 38 and external resources 24. Delay values corresponding to these set instructions are sent to timer 36 from internal resources 38 and external resources 24 or, in the alternative, from controller 34. Timer 36 receives the first delay value from this series of delay values and sets a delay time equal to the received delay value. In this embodiment, the delay time is also referred to as the remaining time.

Timer 36 decrements the delay time and receives subsequent delay values in the series of delay values. As each delay value in the series of delay values is received by timer 36, the received delay value is compared to the decremented delay time and the larger of the two delay times is stored as the delay time.

CPU 46 continues to execute test program and operating system instructions out of memory 48 while the delay time is counting down. Controller 34 passes test measurement instructions to internal resources 38 and external resources 24 during this time. After the delay time has reached zero, timer 36 transmits a remaining time ready signal that indicates the delay time has reached zero. The remaining time ready signal is transmitted to controller 34 and directly to internal resources 38 and external resources 24. Upon receiving the remaining time ready signal, test measurements are taken from DUT 26. In this embodiment, the delay manager is incorporated into timer 36.

Figure 2:
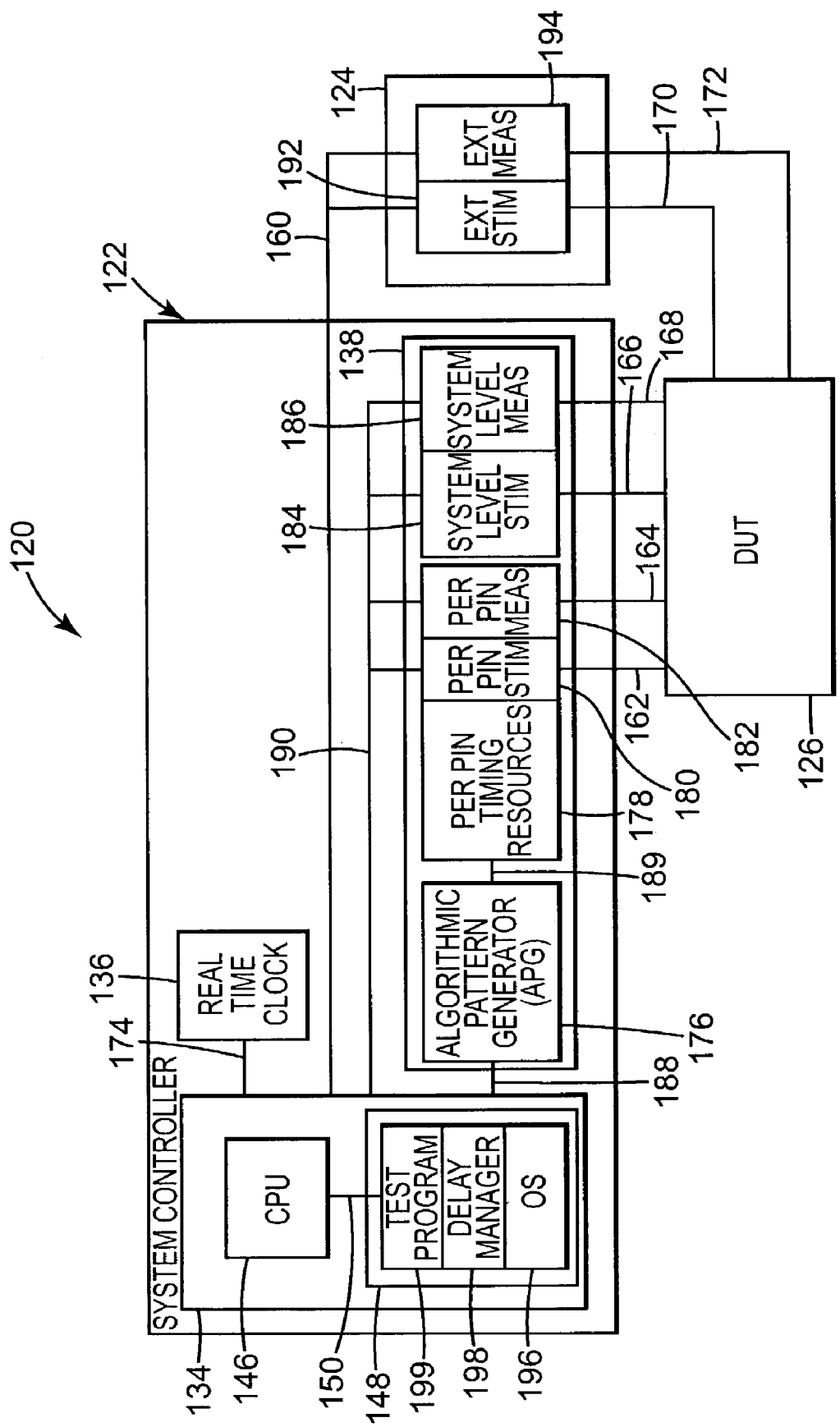
FIG. 2 is a block diagram illustrating an exemplary computer system in which an exemplary embodiment of the delay manager, according to the present invention, is implemented.

FIG. 2 is a block diagram illustrating an exemplary computer system 120 in which an exemplary embodiment of the delay manager is implemented. Computer system 120 includes a circuit test system 122, external resources 124 and a DUT 126. Test system 122 is electrically coupled to DUT 126 through per pin stimulus bus 162 and per pin measurement bus 164. Test system 122 is also electrically coupled to DUT 126 through system level stimulus bus 166 and system level measurement bus 168. In addition, test system 122 is electrically coupled to external resources 124 through external resource bus 160. External resources 124 are electrically coupled to DUT 126 through external stimulus bus 170 and external measurement bus 172.

Test system 122 includes a system controller 134, a real time clock 136, and internal resources 138. System controller 134 is electrically coupled to real time clock 136 through clock bus 174. Controller 134 is electrically coupled to internal resources 138 through algorithmic pattern generator (APG) bus 188 and internal stimulus and measurement bus 190. In addition, controller 134 is electrically coupled to external resources 124 through external resource bus 160.

Internal resources 138 include an APG 176, per pin timing resources 178, per pin parametric stimulus resources 180, per pin parametric measurement resources 182, system level parametric stimulus resources 184 and system level parametric measurement resources 186. APG 176 is electrically coupled to controller 134 through APG bus 188 and to per pin timing resources 178 through APG timing bus 189. Controller 134 passes functional test vectors to APG 176 and APG 176 passes functional test results back to controller 134 over APG bus 188. Per pin timing resources 178 communicate with per pin stimulus resources 180 and per pin measurement resources 182 to functionally test DUT 126.

Controller 134 sets per pin stimulus resources 180 and receives per pin measurement results from per pin measurement resources 182 over internal stimulus and measurement bus 190. Similarly, controller 134 sets system level stimulus resources 184 and receives system level measurements from system level measurement resources 186 over internal stimulus and measurement bus 190.

Per pin stimulus resources 180 apply voltages and currents to pins on DUT 126 over per pin stimulus bus 162. Per pin measurement resources 182 take measurements from pins on DUT 126 over per pin measurement bus 164. Similarly, system level stimulus resources 184 apply signals over system level stimulus bus 166 and system level measurement resources 186 take measurements over system level measurement bus 168. System level stimulus resources 184 include voltage and current sources for setting DUT 126 operating conditions. System level measurement resources 186 include devices for taking voltage and current measurements from DUT 126.

External resources 124 include external parametric stimulus resources 192 and external parametric measurement resources 194. Controller 134 is electrically coupled to external stimulus resources 192 and external measurement resources 194 over external resource bus 160. External stimulus resources 192 are electrically coupled to DUT 126 over external stimulus bus 170 and external measurement resources 194 are electrically coupled to DUT 126 over external measurement bus 172. External resources 124 apply signals to and take measurements from DUT 126 through external stimulus and measurement buses 170 and 172.

External resources 124 include user-defined resources that apply special voltages and currents to DUT 126 and result in unique measurements from DUT 126. External resources 124 can be add on devices designed to interface with test system 122 and controller 134. Custom designed external resources 124 are usually designed for a particular type of DUT 126.

System controller 134 includes CPU 146 electrically coupled to memory 148 through CPU bus 150. CPU 146 is a single microprocessor and memory 148 is random access memory (RAM). However, in other embodiments, different processing units can be used such as a mainframe processor, multiple processors or a micro-controller. Also, other memories can be used, with or without RAM memory 148, including electrically erasable programmable read only memory (EEPROM), flash memory and hard drive storage devices.

In the present embodiment, memory 148 is loaded with operating system 196, delay manager 198, and test program 199. Operating system 196 and delay manager 198 are loaded into memory 148 as test system 122 is powered up. Operating system 196 includes instructions for a user interface (not shown) including a display, keyboard, mouse, floppy disk drive and other devices, such as a network connection. Operating system 196 also includes instructions for interpreting API test program instructions. Delay manager 198 includes instructions to manage settling time delay values for test system 122. Settling time delay values include delay values for per pin stimulus resources 180, system level stimulus resources 184, and external stimulus resources 192. Delay manager 198 provides one delay time for hardware resources set in a series of test program instructions.

A user, such as a test engineer, loads test program 199 to memory 148 using the user interface. Test program 199 is loaded from a floppy disk, hard drive or network connection. Test program 199 includes API test program instructions to set stimulus resources and call measurement resources for checking DUT 126. CPU 146 executes operating system 196, delay manager 198 and test program 199 out of memory 148.

Test program 199 includes API test program instructions that direct internal resources 138 and external resources 124 to test DUT 126. Some API test program instructions set output voltages and currents on stimulus resources, such as per pin stimulus resources 180, system level stimulus resources 184, and external stimulus resources 192. These internal and external resources 138 and 124 need time to settle before accurately providing a voltage or current level. Test program 199 includes a delay value table and automatically supplies a settling time delay value or test program 199 includes a user-supplied delay value. Operating system 196 interprets the API instruction from test program 199 and passes automatically supplied and user-supplied delay values to delay manager 198.

Test program 199 also includes API test program instructions that direct internal resources 138 and external resources 124 to take measurements from DUT 126. Some of these measurement instructions direct test system 122 to wait for hardware resources to settle before taking a measurement. Instructions that direct test system 122 to wait for the delay time to expire include APG functionality testing and parametric measurement tests. Test program 199 also includes instructions that do not require waiting for delay time to expire. These instructions can be executed during the time between setting hardware resources that provide delay values and calling measurement functions that must wait for delay time to expire.

During operation, controller 134 executes test program 199 and directs internal resources 138 and external resources 124 to apply voltages and currents to pins on DUT 126, and take measurements from DUT 126. Test program 199 and operating system 196 supply settling time delay values to delay manager 198. Delay manager 198 provides one delay time for all needed settling times.

For internal resources 138, controller 134 directs per pin stimulus resources 180 and system level stimulus resources 184 to apply voltages and currents to pins on DUT 126. These per pin stimulus resources 180 and system level stimulus resources 184 need some time to settle to desired levels. Test program 199 and operating system 196 supply the needed settling time delay values to delay manager 198.

Later, controller 134 directs internal resources 138 to take measurements with per pin measurement resources 182 and system level measurement resources 186. These parametric measurement units measure parameters such as logic levels, voltages and currents on pins of DUT 126. Some per pin measurement resources 182 and system level measurement resources 186 must wait for the one delay time to elapse and stimulus resources to settle before taking a measurement. This helps to ensure accurate measurements.

Also during operation, controller 134 under the direction of test program 199 passes functional test vectors to APG 176. In turn, APG 176 passes timing requirements to per pin timing resources 178. Voltage levels on DUT 126 are set by per pin stimulus resources 180 according to per pin timing resources 178. Per pin measurement resources 182 check logic levels on outputs of DUT 126 against the functional vectors. APG 176 does not execute the functional vectors until the delay time has elapsed and resources have settled.

Controller 134 under the direction of test program 199 also sets external stimulus resources 192 and external measurement resources 194. External stimulus resources 192 apply voltages, currents or waveforms to pins on DUT 126. As with internal resources 138, external stimulus resources 192 can require settling times. A test engineer usually writes delay values into test program 199 for external stimulus resources 192, as these resources are often custom devices produced for a particular type of DUT 126. Test program 199 provides these delay values to operating system 196, which passes the delay values to delay manager 198. Later, test program 199 calls external measurement resources 194 to measure voltages and currents from DUT 126. As with other measurement resources, some of these must wait for delay time to elapse.

Delay manager 198 receives all needed settling time delay values from test program 199 and operating system 196 as a series of delay values, one after the other, in time. Delay manager 198 receives the series of delay values and in response to each delay value in the series of delay values, delay manager 198 retrieves a corresponding current time from real time clock 136. This current time corresponds to the received delay value. Delay manager 198 sums the received delay value and retrieved corresponding current time to get a total result called a delay time value. The first delay time value is stored as a delay time, which is also called a settling time, as this is the time it will take for the hardware resource to settle. Real time clock 136 continues to count toward the stored delay time. Next, delay manager 198 receives subsequent delay values in the series of delay values, retrieves corresponding current time values from clock 136 and calculates corresponding delay time values. Each delay time value is, in turn, checked against the stored delay time in memory. If a delay time value is greater than the stored delay time, the stored delay time is updated to the greater delay time value. Here, greater or larger refers to a time, which is further in the future, regardless of clock or counter rollover.

Test program 199 is written to include many set stimulus resource instructions in a row or series. Delay manager 198 receives the series of needed delay values and updates the delay time to the time needed for all resources to settle. After setting multiple stimulus resources, test program 199 can include any number of instructions that do not require waiting for the delay time to elapse. These instructions execute while hardware resources settle. Eventually, test program 199 includes an APG instruction or measurement instruction that must wait for the delay time to elapse. CPU 146 executes delay manager 198 to check current time from real time clock 136 against the delay time. After current time has reached the delay time, CPU 146 executes the APG or measurement test. Processing continues with test program 199.

In another embodiment, delay manager 198 receives each delay value in the series of delay values and adds nothing to this value to get a corresponding delay time value. Delay manager 198 stores the first delay time value as a delay time, which is a remaining time, and decrements this stored delay time (i.e., remaining time) toward zero. Subsequent delay time values are compared to the decremented stored delay time (remaining time), and the delay time is updated to the greater or larger of the two. The updated delay time is the delay needed for all settling times. After the series of instructions setting stimulus resources, test program 199 can provide instructions that do not require waiting for the delay time to elapse. These instructions are executed as the delay time decrements toward zero. Next, test program 199 provides an APG or measurement instruction that must wait for delay time to reach zero before performing a test. After delay time reaches zero, the APG or measurement instruction is executed and processing returns to the test program 199.

Figure 3:
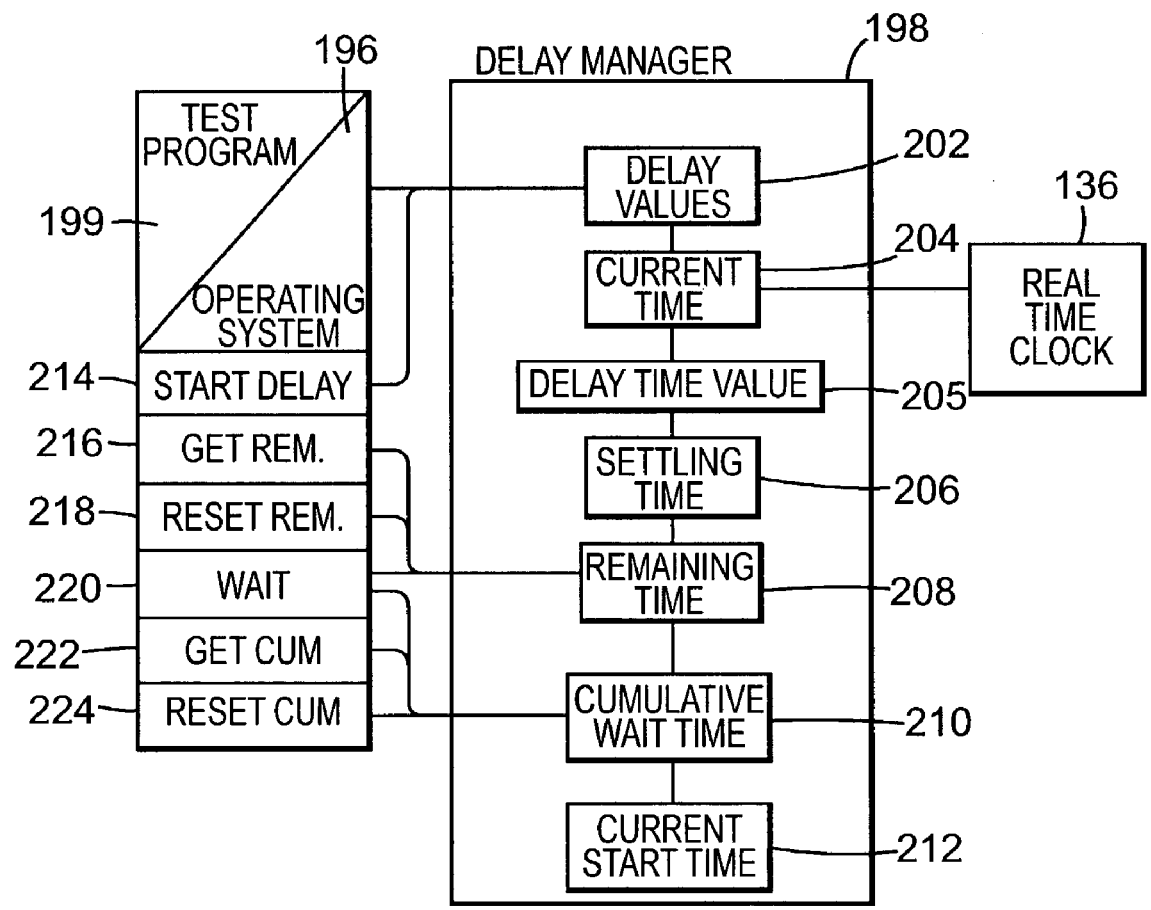
FIG. 3 is a block diagram illustrating an exemplary embodiment of the delay manager of the present invention in communication with the operating system and real time clock.

FIG. 3 is a block diagram illustrating an exemplary embodiment of delay manager 198 in communication with operating system 196 and real time clock 136. Delay manager 198 includes storage elements that store a received delay value 202, current time 204, delay time value 205, settling time 206, remaining time 208, cumulative wait time 210 and current start time 212. The storage elements are locations in memory 148. However, in other embodiments, the storage elements can be microprocessor registers or other memory devices in combination with memory 148.

Delay value 202 is a settling time delay value received by delay manager 198 from test program 199 and operating system 196. Delay value 202 is a user-supplied delay value or an automatically supplied delay value. Current time 204 is the current time retrieved from real time clock 136. The delay time value 205 is the sum of a delay value 202 and a corresponding current time 204. Settling time 206 is the greatest or largest delay time value 205 in a series of delay time values 205. Remaining time 208 is the time remaining before all resources have settled and measurements can be taken. Cumulative wait time 210 is the cumulative time test system 122 waits after encountering measurement instructions that must wait before taking a measurement. Current start time 212 is the corresponding current time 204 used to calculate delay time value 205, which was used to update settling time 206.

Six API test program instructions are provided for using delay manager 198 with custom hardware and for debug purposes. These instructions are start delay 214, get remaining time 216, reset remaining time 218, wait for delay time 220, get cumulative wait time 222 and reset cumulative wait time 224. Each instruction can be used at any time in test program 199.

Start delay 214 instructs operating system 196 and delay manager 198 to use a provided user-supplied delay value. Get remaining time 216 instructs delay manager 198 to provide remaining time 208 to operating system 196. This remaining time 208 can be used to determine how much processing can be done before an APG or measurement instruction is inserted in test program 199. Reset remaining time 218 sets remaining time 208 to zero and also stops delay manager 198.

After a delay time is provided, wait for delay time 220 instructs delay manager 198 to wait for delay time to expire. If this means test system 122 must wait, then delay manager 198 first adds remaining time 208 to cumulative wait time 210. Cumulative wait time 210 is also increased if test program 199 provides an APG or measurement instruction and test system 122 must wait. In this situation, remaining time 208 is also added to cumulative wait time 210. Cumulative wait time 210 can be used to determine how much time is spent waiting in a wait loop. Get cumulative wait time 222 instructs delay manager 198 to provide the cumulative wait time 210 to operating system 196. Reset cumulative wait time 224 instructs delay manager 198 to set cumulative wait time 210 to zero.

Using these instructions, a user can set delay times as needed for custom hardware with start delay 214. Also, the user can use wait for delay time 220 to instruct test system 122 to wait for custom hardware resources to settle before taking a measurement. Get remaining time 216, reset remaining time 218, get cumulative wait time 222 and reset cumulative wait time 224 can be used to optimize operation of test program 199.

In another embodiment, a 32-bit counter running at 1 megahertz replaces real time clock 136. This counter rolls over from its maximum value to zero in about one hour and eleven minutes. If roll over occurs while delay manager 198 is receiving delay values 202, it appears that retrieved corresponding current time values 204 get drastically smaller rather than greater. This condition is remedied by detecting roll overland accounting for it. To detect roll over, the corresponding current time value used to calculate the last updated settling time 206 is stored as a current start time 212. If the next corresponding current time value 204 is less than current start time 212, the 32-bit counter has rolled over. With this knowledge, settling time 206 can be adjusted by subtracting the maximum 32-bit counter value. The corresponding delay time value 105 is compared to this roll over adjusted settling time 206. As before, settling time 206 is updated to the larger of the two values and if settling time 206 is updated, remaining timing 208 is updated to the received delay value 202. Processing continues as before with delay manager 198 receiving delay values 202 from operating system 196 and test program 199.

In operation, delay manager 198 receives a delay value 202 from test program 199 via operating system 196. In response to receiving delay value 202, delay manager 198 retrieves a corresponding current time 204 from clock 136. Next, delay manager 198 sums delay value 202 and the corresponding current time 204 to get a delay time value 205. This delay time value 205 is compared to settling time 206. If delay time value 205 is greater than settling time 206, settling time 206 is updated to delay value 205. Otherwise, if delay time value 205 is less than or equal to settling time 206, the settling time 206 is not updated. Next, if settling time 206 is updated, remaining time 208 is updated to the difference between the corresponding current time 204 and settling time 206, which is delay value 202.

Real time clock 136 counts toward settling time 206 and remaining time 208 decrements toward zero. Real time clock 136 reaches settling time 206 as remaining time 208 reaches zero. Delay manager 198 can use either event to indicate that delay time has elapsed. In one embodiment, delay manager 198 checks an updated current time 204 against settling time 206 and responds with a settling time ready signal when they are equal. In another embodiment, delay manager 198 checks an updated current time 204 to see if it is between current start time 212 and settling time 206. If the current time 204 is between current start time 212 and settling time 206, then test system 122 continues to wait before executing an APG or measurement instruction. In another embodiment, delay manager 198 checks to see if remaining time 208 has reached zero and responds with a remaining time ready signal when it equals zero. Delay time is the settling time 206 and the remaining time 208.

To further explain operation, delay manager 198 receives a series of delay values 202 from operating system 196 and test program 199. After the first delay value 202 is received, settling time 206 and remaining time 208 are set to their initial values. Real time clock 136 increments and remaining time 208 decrements. Delay manager 198 receives the next delay value 202 from operating system 196 after time has passed. In response to receiving another delay value 202, delay manager 198 retrieves a corresponding current time 204 from real time clock 136. This corresponding current time 204 is greater than previous current time values. The received delay value 202 is summed with the corresponding current time 204 to get a corresponding delay time value 205. The corresponding delay time value 205 is compared with settling time 206 and the greater of the two is stored as settling time 206. If settling time 206 is updated, remaining time 208 is updated to delay value 202, which was used to calculate the updated settling time 206. In this manner, the delay time, which is settling time 206 and remaining time 208, is updated with the appropriate value. Processing continues with subsequent delay values 202 until test program 199 is done setting hardware resources. At this point, settling time 206 and remaining time 208 are the largest delay time needed to ensure all set hardware resources settle. Real time clock 136 increments and remaining time 208 decrements to count down the delay time.

While hardware resources settle, test system 122 is free to execute instructions that do not require waiting for delay time to elapse. These instructions are from test program 199 and operating system 196. Test program 199 eventually includes an APG or measurement instruction that must wait for delay time to elapse. In this situation, if test system 122 must wait, remaining time 208 is added to cumulative wait time 210. Delay manager 198 checks current time 204 against settling time 206 or remaining time 208 against zero, depending on the embodiment. When these events occur, delay manager responds with the settling time ready signal or remaining time ready signal to operating system 196 and the APG or measurement test is completed. Next, processing returns to test program 199.

Figure 4:
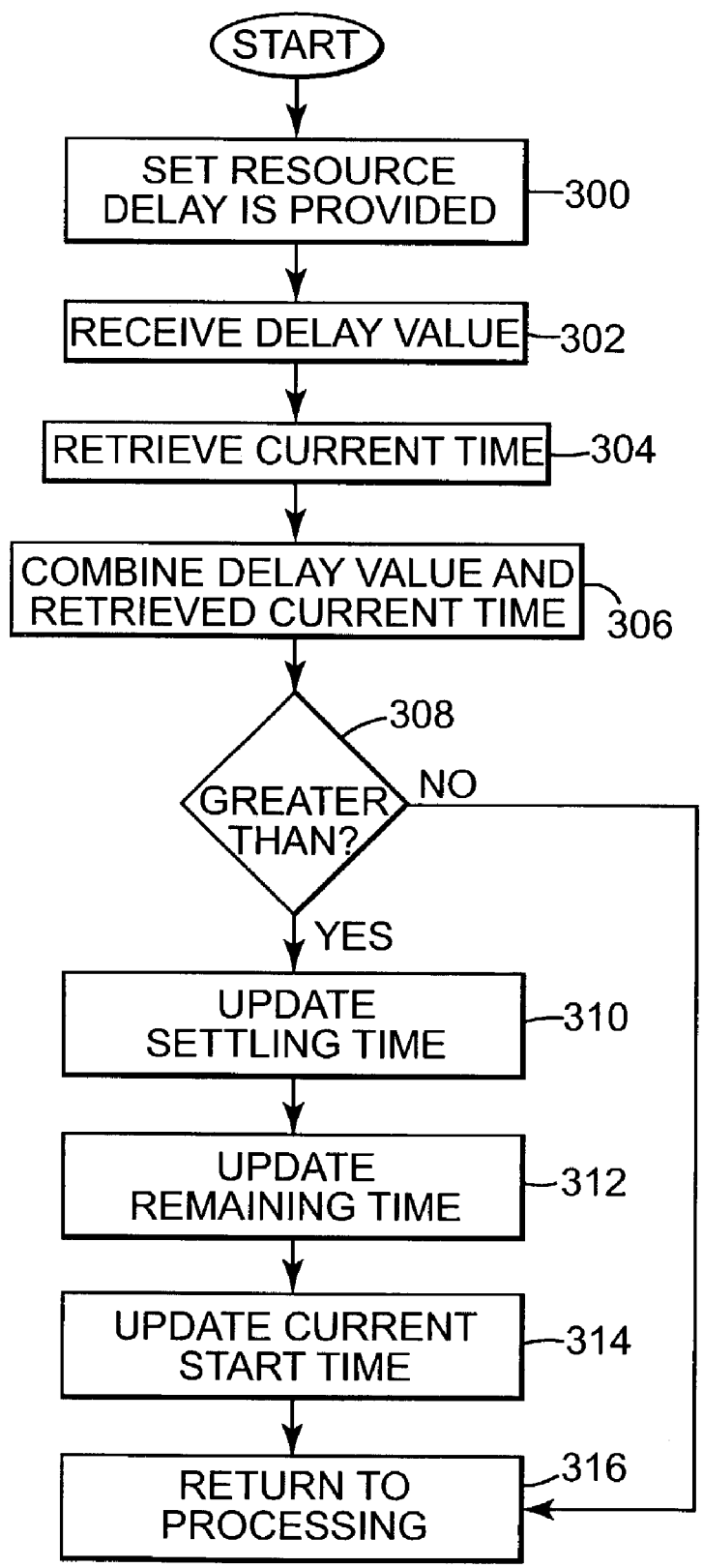
FIG. 4 is a flow chart illustrating delay manager operation, according to one embodiment of the present invention.

FIG. 4 is a flow chart illustrating operation of delay manager 198, according to one embodiment of the present invention. As indicated at 300, test program 199 sets a hardware resource and automatically provides a delay value 202 to delay manager 198. As indicated at 302, delay manager 198 receives delay value 202 from operating system 196 and, at 304 delay manager 198 retrieves a corresponding current time 204 from real time clock 136. Next, delay manager 198 combines delay value 202 and retrieved corresponding current time 204 to get a corresponding delay time value 205, as indicated at 306. This combination is an addition of delay value 202 and retrieved corresponding current time 204. At 308, corresponding delay time value 205 is compared to settling time 206. If the corresponding delay time value 205 is greater than settling time 206, processing continues at 310 where settling time 206 is updated to the corresponding delay time value 205. Next, at 312, remaining time 208 is updated to delay value 202, which was used to calculate corresponding delay time value 205. At 314, current start time 212 is updated to the corresponding current time 204 used to calculate corresponding delay time value 205. Processing then returns to test program 199, at 316. If the corresponding delay time value 205 is not greater than settling time 206 at 308, processing returns to test program 199 at 316 without updating settling time 206, remaining time 208 and current start time 212.

Each time test program 199 sets a hardware resource that requires a settling time, a delay value 202 is provided to delay manager 198 from operating system 196 and processing once again begins at 300. This procedure is repeated until test program 199 does not set any more hardware resources requiring a settling time. After test program 199 is done setting hardware resources, test program 199 is free to process instructions that do not require waiting for the delay time to elapse. Eventually, test program 199 calls the APG or a measurement resource that must wait for the delay time to expire.

In another embodiment of the present invention, test program 199 sets a hardware resource and provides a delay value 202 to delay manager 198, as indicated at 300. Delay manager 198 receives delay value 202, as indicated at 302. However, instead of continuing at 304 and 306, processing continues at 308, where delay manager 198 compares the received delay value 202 to remaining time 208. If the received delay value 202 is not greater than remaining time 208 processing returns to test program 199, as indicated at 316. If the delay value 202 is greater than remaining time 208, at 308, processing continues with 312, where remaining time 208 is updated to the received delay value 202. In this embodiment, settling time 206 and current start time 212 are not used and therefore are not updated. After remaining time 208 is updated processing returns to test program 199, as indicated at 316.

In this embodiment, remaining time 208 decrements as time passes. Subsequent delay values received from test program 199 and operating system 196 are compared to remaining time 208 and, if greater, remaining time 208 is updated to the larger value. After test program 199 is through setting hardware resources that require a settling time, test program 199 is free to process instructions that do not require waiting for remaining time 208 to reach zero. Eventually, test program 199 calls the APG or a measurement resource that must wait until the delay time has expired before executing. As described in these embodiments, delay time is set as a settling time 206 or a remaining time 208.

Figure 5:
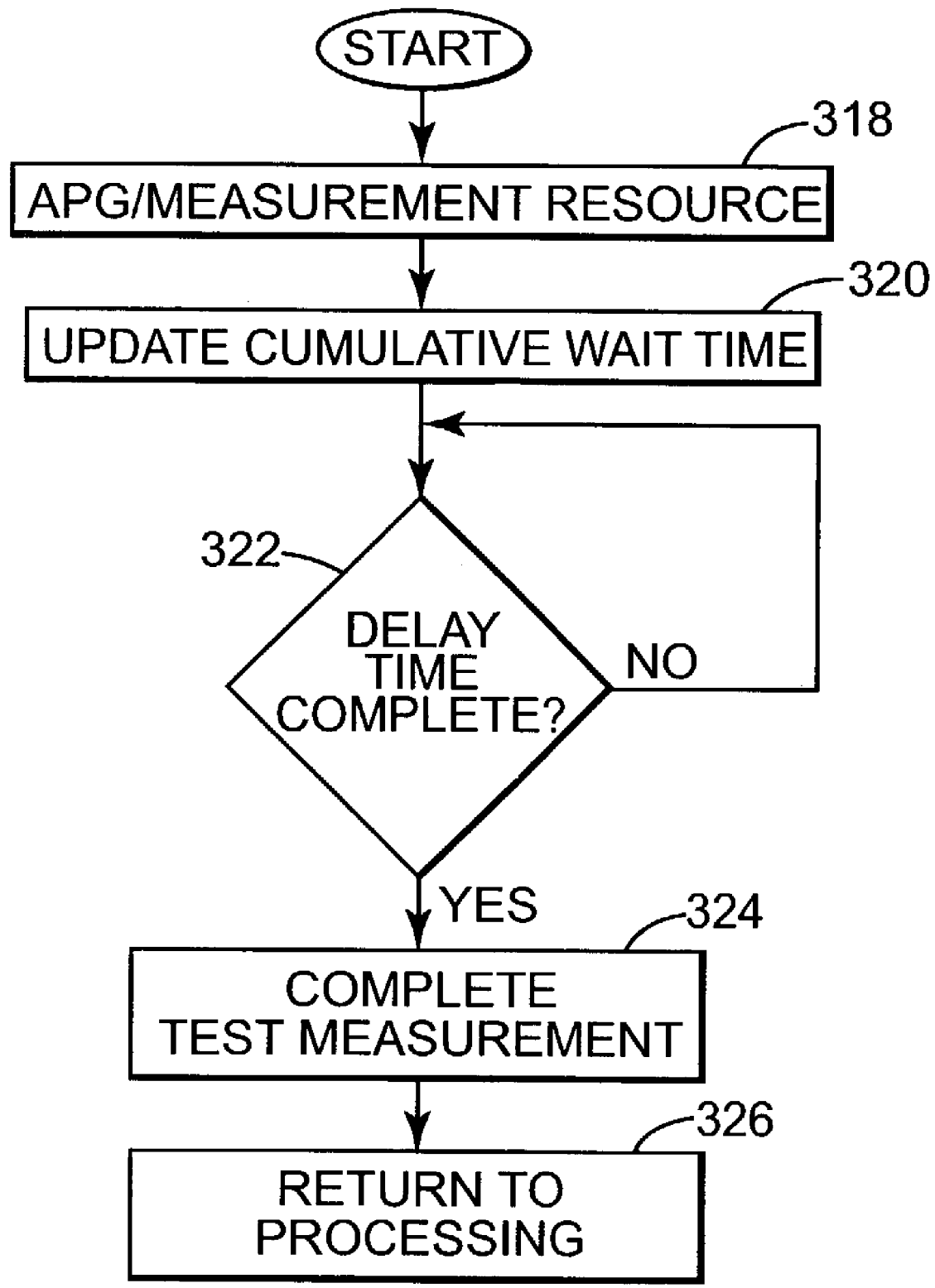
FIG. 5 is a flow chart illustrating delay manager processing of an APG or measurement resource instruction that must wait for delay time to expire.

FIG. 5 is a flow chart illustrating delay manager 198 processing an APG or measurement resource instruction that must wait for delay time to expire. As indicated at 318, test program 199 calls the APG or measurement resource that must wait for delay time to expire. At 320, delay manager 198 adds remaining time 208 to cumulative wait time 210 and stores the result back in cumulative wait time 210. Next, delay manager 198 checks to see if delay time has elapsed, at 322. This is done differently in different embodiments.

In one embodiment, settling time 206 is compared to current time 204 retrieved from real time clock 136. When current time 204 reaches settling time 206, delay time has expired. In another embodiment, remaining time 208 is compared to zero. When remaining time 208 reaches zero the delay time has elapsed. In yet another embodiment, current time 204 is retrieved and compared to current start time 212 and settling time 206. If retrieved current time 204 is between current start time 212 and settling time 206, the delay manager 198 continues to wait. As soon as retrieved current time 204 is not between current start time 212 and settling time 206, delay time has expired. In each embodiment, after delay time is reached processing continues with completing the measurement or APG functionality test, as indicated at 324. Next, processing returns to test program 199, as indicated at 326.

Figure 6:
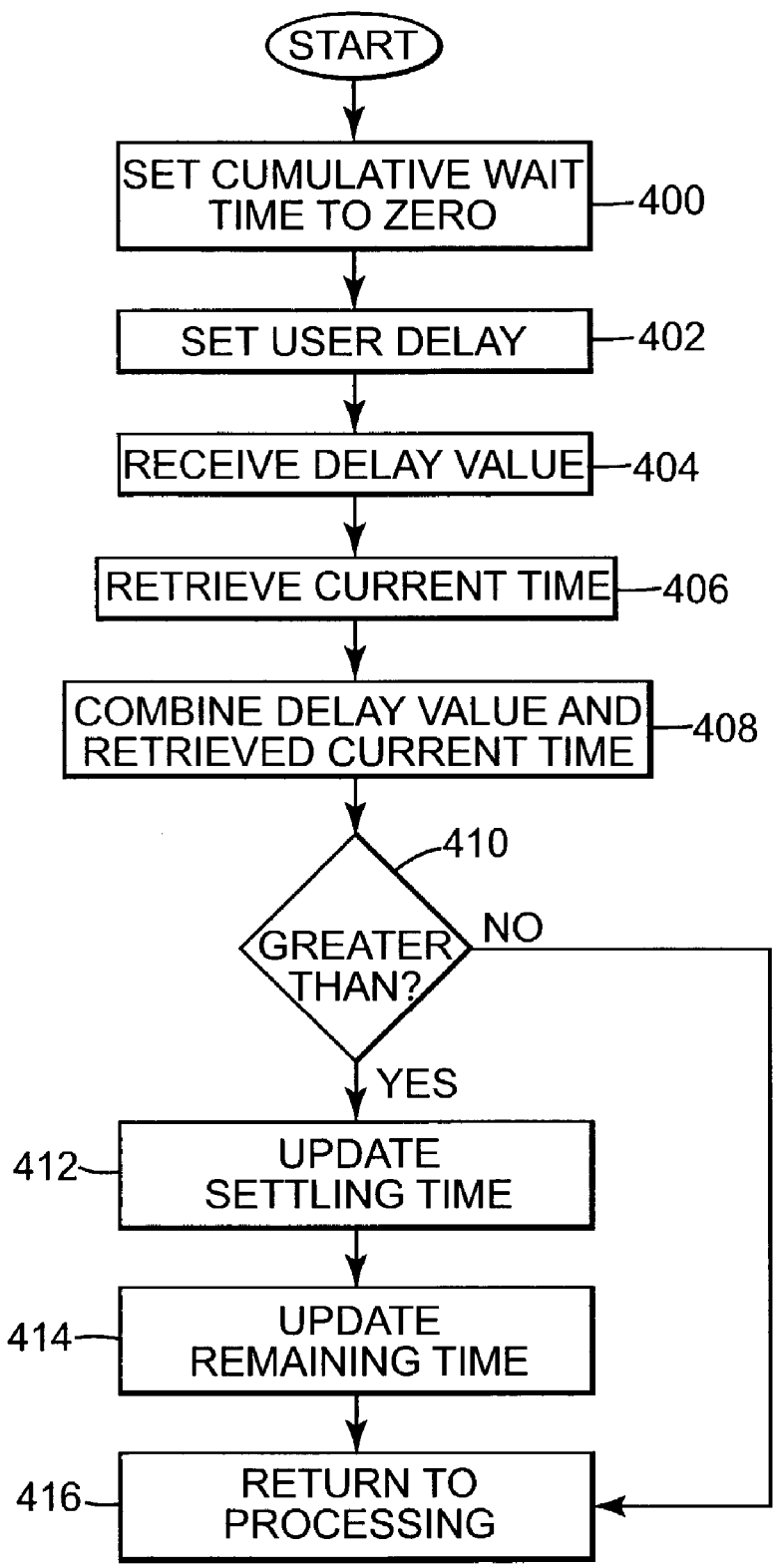
FIG. 6 is a flow chart illustrating a test program instruction sequence for custom hardware resources and test program optimization.
Figure 7:
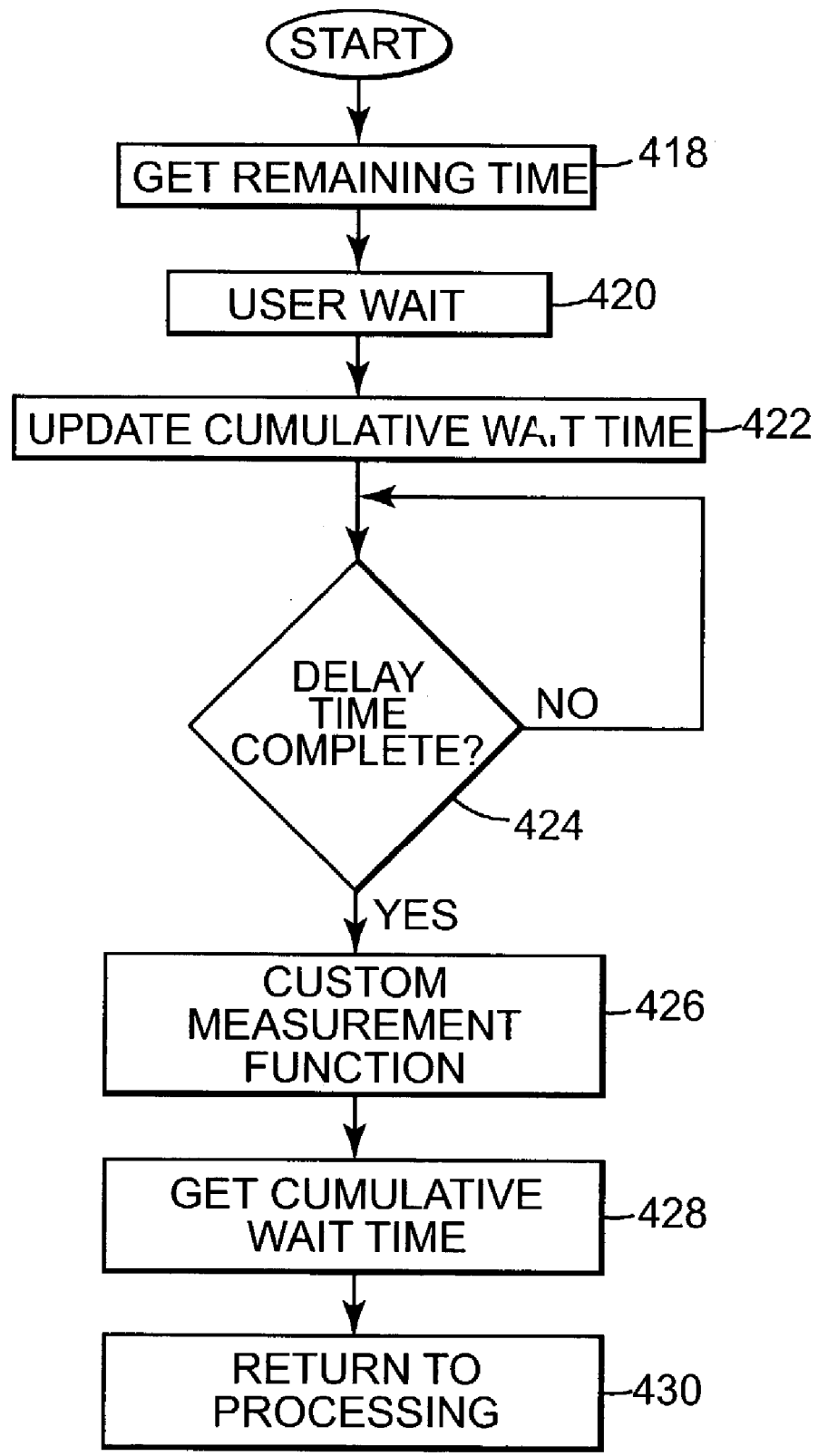
FIG. 7 is a flow chart illustrating a test program measurement sequence for custom hardware resources and test program optimization.

FIGS. 6 and 7 illustrate one way of using the API test program instructions provided for custom hardware resources and optimization of test program 199. These instructions can be used in any order and at any time in test program 199. In the following example sequence, cumulative wait time 210 and remaining time 208 are acquired during the measurement sequence, illustrated in FIG. 7, for use in optimizing the test program 199.

FIG. 6 is a flow chart illustrating a test program instruction sequence for custom hardware resources and test program optimization. To start, as indicated at 400, cumulative wait time 210 is set to zero with reset cumulative wait time instruction 224. Next, a user-supplied delay value 202 is provided with start delay 214, as indicated at 402. Delay manager 198 receives the user-supplied delay value 202, at 404, and retrieves a corresponding current time 204 from real time clock 136, at 406. As indicated at 408, delay manager 198 combines delay value 202 and corresponding current time 204. This combination is a summing of delay value 202 and corresponding current time 204 resulting in a corresponding delay time value 205. The corresponding delay time value 205 is compared to settling time 206, at 410. If corresponding delay time value 205 is greater than settling time 206, settling time 206 is updated to corresponding delay time value 205, as indicated at 412. Next, remaining time 208 is updated to delay value 202, at 414, and processing returns to test program 199, at 416. If corresponding delay time value 205 is not greater than settling time 206, at 410, settling time 206 and remaining time 208 are not updated. In either situation, processing returns to test program 199, at 416, where test program 199 is free to execute instructions that do not wait for delay time to expire. After processing these instructions, test program 199 continues with processing a measurement instruction.

FIG. 7 is a flow chart illustrating the example test program measurement sequence for custom hardware resources and test program optimization. As indicated at 418, test program 199 retrieves remaining time 208 with the get remaining time instruction 216. Retrieving the remaining time 208 is done before providing an instruction that must wait for delay time to expire. With the retrieved remaining time 208, the user can adjust the number of instructions processed that do not wait for delay time to expire in test program 199 to optimally use the remaining time 208. Test program 199 provides wait for delay time 220, at 420, to wait for hardware resources to settle before providing a measurement instruction. Delay manager 198 increases cumulative wait time 210 with remaining time 208, at 422. Next, delay manager 198 checks to see if delay time has expired at 424. As previously described, this can be done in different ways. In the present embodiment, current time 204 is retrieved from real time clock 136 and compared against settling time 206. When current time 204 reaches settling time 206, processing continues with test program 199 and a custom measurement function, as indicated at 426.

After taking a measurement, test program 199 instructs delay manager 198 to provide cumulative wait time 210 using get cumulative wait time 222, as indicated at 428. Since cumulative wait time 210 was cleared at 400, the retrieved cumulative wait time 210 includes only remaining time 208 added at 422. This provides information about the amount of time spent waiting for delay time to expire at 424. As indicated at 430, processing continues with test program 199. This example, as illustrated in FIGS. 6 and 7, shows only one way of using the API test program instructions provided for custom hardware resources and optimization of test program 199. These instructions can be used in any order and at any time in test program 199.

Figure 8:
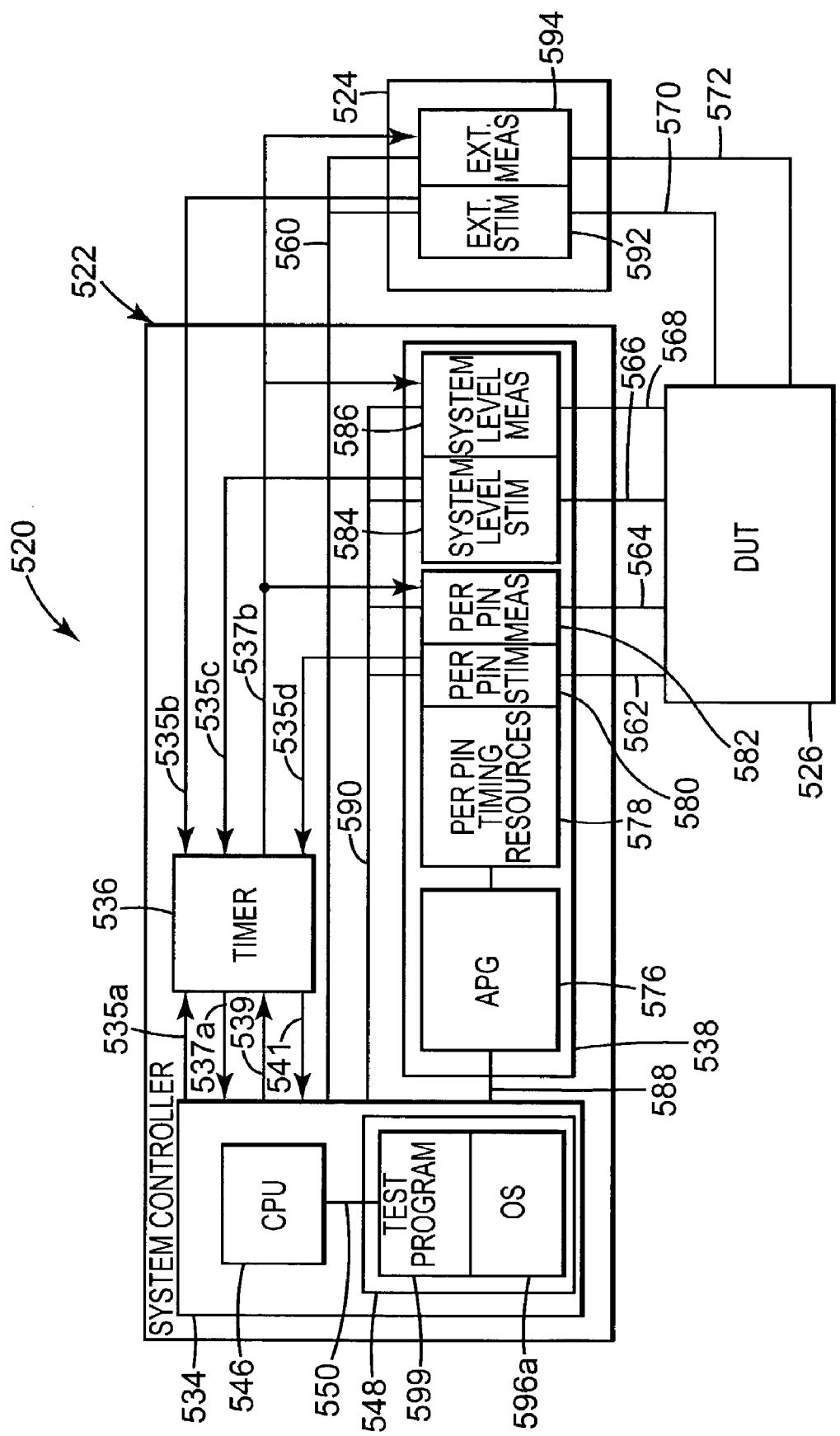
FIG. 8 is a block diagram illustrating another exemplary computer system including another exemplary embodiment of a delay management system, according to the present invention.

FIG. 8 is a block diagram illustrating another exemplary computer system 520 including another exemplary embodiment of a delay management system, according to the present invention. Computer system 520 includes a circuit test system 522, external resources 524 and a DUT 526. Test system 522 includes a system controller 534, internal resources 538 and timer 536. Internal resources 538 include an APG 576, per pin timing resources 578, per pin stimulus resources 580, per pin measurement resources 582, system level stimulus resources 584 and system level measurement resources 586. System controller 534 includes a CPU 546 and memory 548 that includes an operating system 596 and a test program 599. External resources 524 include external stimulus resources 592 and external measurement resources 594.

In the present embodiment, a delay manager is implemented in a timer, which includes delay management hardware, indicated at 536. The timer 536 communicates directly and through system controller 534 with internal resources 538 and external resources 524. In other embodiments, timer 536 can be configured to communicate only directly with external resources 524 and internal resources 538 or, in the alternative, only through system controller 534. In the present described embodiment, test system 522 can be configured such that controller 534 and timer 536 communicate with external resources 524 and internal resources 538 in any combination of setting hardware resources and calling APG and measurement resources.

System controller 534 is electrically coupled to internal resources 538 through APG bus 588 and internal resource bus 590. Controller 534 is electrically coupled to APG 576 through APG bus 588. Also, controller 534 is electrically coupled to per pin stimulus resources 580, per pin measurement resources 582, system level stimulus resources 584 and system level measurement resources 586 though internal resource bus 590. In addition, controller 534 is electrically coupled to external resources 524 through external resource bus 560. Controller 534 transmits and receives control signals for internal resources 538 and external resources 524 through buses 588, 590 and 560.

Internal resources 538 and external resources 524 are electrically coupled to DUT 526. Per pin stimulus resources 580 are electrically coupled to DUT 526 through per pin stimulus bus 562. Per pin measurement resources 582 are electrically coupled to DUT 526 through per pin measurement bus 564. System level stimulus resources 584 are electrically coupled to DUT 526 through system level stimulus bus 566, and system level measurement resources 586 are electrically coupled to DUT 526 through system level measurement bus 568. Also, external stimulus resource 592 is electrically coupled to DUT 526 through external stimulus bus 570 and external measurement resource 594 is electrically coupled to DUT 526 through external measurement bus 572. Internal resources 538 and external resources 524 apply voltage and current signals and take measurements through these buses.

Internal resources 538 perform similar functions to internal resources 138 previously described in this specification. APG 576 generates patterns for functional testing as instructed by test program 599 and operating system 596. APG 576 transmits functional test pattern timing information to per pin timing resources 578. According to instructions from per pin timing resources 578, per pin stimulus resources 580 and per pin measurement resources 582 apply signals to and take measurements from DUT 526 for functional testing. In this manner, test system 522 functionally tests DUT 526. Multiple functional tests performed on DUT 526 often involve changing system level stimulus resources 584 and system level measurement resources 586 prior to execution.

Test program 599 and operating system 596 control per pin stimulus resources 580, per pin measurement resources 582, system level stimulus resources 584 and system level measurement resources 586 through internal resource bus 590. Using these resources, test program 599 changes voltages and currents applied to pins on DUT 526 for DC parametric testing. Test program 599 can use test vectors applied through APG 576 to set up DUT 526 for parametric testing. Test program 599 also sets up per pin limits and system level limits for per pin measurement resources 582 and system level measurement resources 586.

External resources 524 function similar to external resources 124 previously described in this specification. Test program 599 and operating system 596 control external stimulus resources 592 through external resource bus 560. External stimulus resources 592 apply voltages and currents to DUT 526. These external resources 592 can be custom designed resources configured to operate with test system 522. Test program 599 and operating system 596 also control external measurement resources 594 through external resource bus 560. External measurement resources 594 can also be custom designed to take custom measurements from DUT 526.

System controller 534 and timer 536 control operation of test system 522. Controller 534 includes CPU 546 electrically coupled to memory 548 through CPU bus 550. CPU 546 is a single microprocessor and memory 548 is RAM. However, in other embodiments, different processing units can be used such as a mainframe processor, multiple processors or a micro-controller. Also, other memories can be used, with or without RAM memory 548, including electrically erasable programmable read only memory (EEPROM), flash memory and hard drive storage devices.

CPU 546 executes test program 599 and operating system 596 out of memory 548. Test program 599 includes instructions for testing DUT 526. Controller 534 controls internal resources 538 and external resources 524 according to the instructions from test program 599. These instructions set hardware resources that have settling times, and also call APG and measurement resources that must wait for set hardware resources to settle. Timer 536 receives delay values from test program 599. Timer 536 also manages these delay values to ensure that hardware resources have settled before measurements are taken.

Timer 536 is electrically coupled to system controller 534, internal resources 538 and external resources 524 through a timer hardware bus (not shown for clarity). Timer 536 receives delay values from controller 534, internal resources 538 and external resources 524 through the timer hardware bus. Delay values are obtained from test program 599 and operating system 596. In some situations, controller 534 transmits delay values, indicated at 535a, directly to timer 536. In other situations, controller 534 transmits instructions to per pin stimulus resources 580, system level stimulus resources 584 and external stimulus resources 592. These resources transmit delay values, indicated at 535b–535d, to timer 536. Per pin stimulus resources 580 transmit delay values 535d to timer 536. System level stimulus resources 584 transmit delay values 535c to timer 536 and external stimulus resources 592 transmit delay values 535b to timer 536. Internal resources 538 and external resources 524 are configured with controller 534 to coordinate sending delay values 535a–535d, referred to as delay value and delay values, to timer 536.

Timer 536 receives each delay value 535a–535d as part of a series of delay values 535a–535d from controller 534, internal resources 538 and external resources 524. Timer 536 includes hardware to receive a first delay value 535a–535d and store the first delay value 535a–535d as delay time in a storage element. This delay time is a remaining time, which is decremented by timer 536. As subsequent delay values 535a–535d are received in the series of delay values 535a–535d, timer 536 compares the decremented delay time to each delay value 535a–535d received. If the received delay value 535a–535d is greater than the delay time, timer 536 updates the delay time (remaining time) to the received delay value 535a–535d. This delay time is decremented and the process of receiving delay values 535a–535d and updating delay time accordingly continues until test program 599 stops setting hardware resources.

After test program 599 is done setting hardware resources, timer 536 continues to decrement delay time towards zero and test program 599 is free to process other instructions. During this time, test program 599 can call APG 576 and measurement resources 582, 586 and 594 that must wait until delay time reaches zero before performing a test or measurement. After delay time reaches zero, timer 536 responds with remaining time ready signals 537a and 537b. In some situations, controller 534 receives remaining time ready signal 537a and directs measurement resources 582, 586, 594 and APG 576 to test DUT 526. In other situations, measurement resources 582, 586, and 594 receive remaining time ready signal 537b and take measurements without controller 534 control. Processing continues with test program 599 setting hardware resources and calling the APG and measurement resources to complete testing of DUT 526.

Timer 536 responds to two API test program instructions for customizing and optimizing test program 599. In one instruction, test program 599 includes a user-supplied delay value 539 transmitted from controller 534 to timer 536. Timer 536 receives delay value 539 and updates delay time to delay value 539. This instruction allows a user to directly set the delay time used by timer 536. In another instruction, test program 599 requests the delay time (remaining time) from timer 536, which responds with the delay time, as indicated at 541, to controller 534. This instruction gives the test programmer visibility of the remaining delay time for optimizing test program 599.

FIGS. 9–12 are diagrams illustrating examples of the delay management system operation. In each example, SET XX is a call to a function that sets a hardware resource that takes XX microseconds to settle. Assume the time for the function to execute is 20 microseconds and the delay time is set at the end of the 20 microseconds. TEST is a call to a function that performs a test. This function must wait for the delay time to elapse before performing the test. Assume the time for the actual test is 20 microseconds. PROCESS XX is a call to a function that does processing for XX microseconds. This processing does not have to wait for delay time to elapse. For simplicity, all examples are shown to start an arbitrary value of 1200 microseconds.

Figure 9:
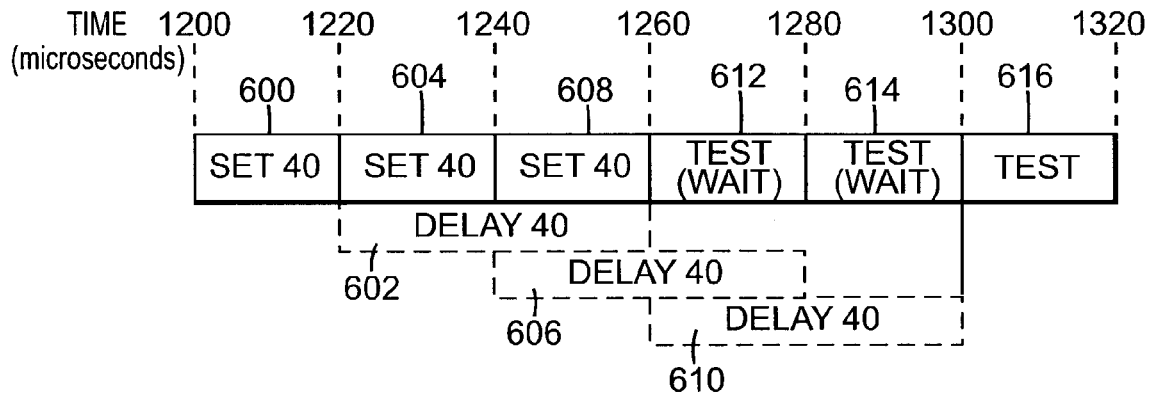
FIG. 9 is a diagram illustrating a first example of a delay management system operation.

As illustrated in FIG. 9 and detailed in Table I, the first example includes a test program having three SET 40 instructions followed by a TEST instruction. This example includes six steps of 20 microseconds each. Table I includes entries for the step number, program operation during the step, start time of the step, end time of the step, and the delay time, which is a settling time and/or a remaining time, as follows:

TABLE I

| STEP | PROGRAM OPERATION | START TIME | END TIME | DELAY TIME SETTLING TIME | DELAY TIME REMAINING TIME |
|---|---|---|---|---|---|
| 1 | SET 40 | 1200 | 1220 | 1260 | 40 |
| 2 | SET 40 | 1220 | 1240 | 1280 | 40 |
| 3 | SET 40 | 1240 | 1260 | 1300 | 40 |
| 4 | TEST (WAIT) | 1260 | 1280 | 1300 | 20 |
| 5 | TEST (WAIT) | 1280 | 1300 | 1300 | 0 |
| 6 | TEST | 1300 | 1320 | | |

In step one, the test program sets a hardware resource having a delay value of 40 microseconds, as indicated at 600. As shown in Table I, this step begins at a start time of 1200 microseconds and ends at an end time of 1220 microseconds. The delay manager sums the delay value of 40 microseconds and the end time of 1220 microseconds to get a result of 1260 microseconds, which is a delay time stored as a settling time. The delay manager stores the delay value of 40 microseconds as a delay time, and more specifically as a remaining time. The delay value of 40 microseconds from step one is indicated at 602.

In step two, the test program sets a hardware resource with a delay value of 40 microseconds, as indicated at 604. Step two begins at 1220 and ends at 1240 microseconds. The delay value of 40 is added to the end time of 1240 to get a settling time of 1280 microseconds. During the time between 1220 and 1240 microseconds, remaining time decrements to 20 microseconds. The delay value of 40 microseconds is compared against the remaining time of 20 microseconds and the larger of the two is stored as the new remaining time, in this case 40 microseconds. The delay value of 40 microseconds from step two is indicated at 606.

In step three, the test program sets a third hardware resource having a delay value of 40 microseconds, as indicated at 608. This step begins at 1240 and ends at 1260 microseconds. The delay value of 40 is added to the end time of 1260 to get a settling time of 1300 microseconds. Remaining time is once again updated to 40 microseconds. The delay value of 40 microseconds from step three is indicated at 610.

In step four, the test program calls a test function, which must wait for delay time to elapse before testing, as indicated at 612. Settling time remains at 1300 and remaining time decrements to 20 microseconds. In step five; the test system is still waiting to test, as indicated at 614. This step begins at 1280 and ends at 1300 microseconds. Settling time remains at 1300 and remaining time decrements to zero. At the end of step five and beginning of step six, the current time of 1300 microseconds is equal to the settling time of 1300 microseconds and remaining time is zero. Delay time has elapsed and the test is performed between a start time of 1300 and end time of 1320 microseconds, as indicated at 616.

In the first example, the time waiting to perform the test is 40 microseconds and the cumulative total wait time increases by this 40 microseconds. If each set instruction were executed independently, the time waiting would have been 120 microseconds. The delay manager reduced wait time by up to 80 microseconds.

Figure 10:
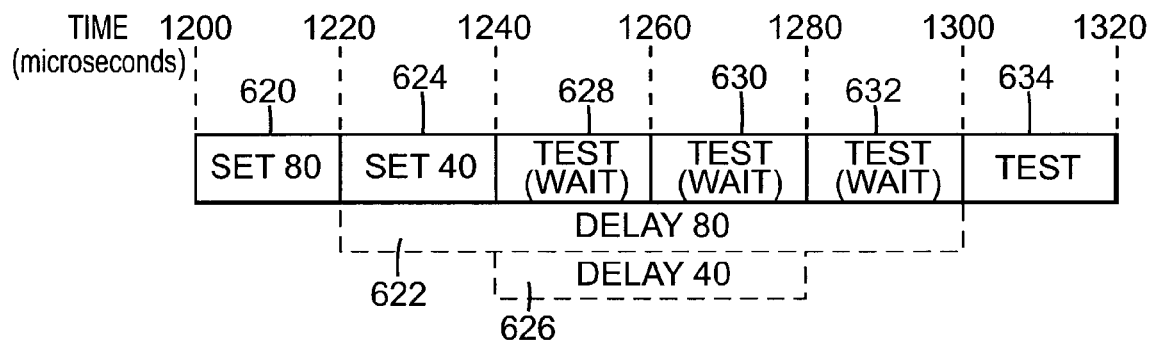
FIG. 10 is a diagram illustrating a second example of a delay management system operation.

As illustrated in FIG. 10 and detailed in Table II, the second example includes one SET 80 and one SET 40 instruction, followed by a TEST instruction. This example is also described in six steps. Table II includes entries for the step number, program operation during the step, start time of the step, end time of the step, and the delay time, which is a settling time and/or a remaining time, as follows:

TABLE II

| STEP | PROGRAM OPERATION | START TIME | END TIME | DELAY TIME SETTLING TIME | DELAY TIME REMAINING TIME |
|---|---|---|---|---|---|
| 1 | SET 80 | 1200 | 1220 | 1300 | 80 |
| 2 | SET 40 | 1220 | 1240 | 1300 | 60 |
| 3 | TEST (WAIT) | 1240 | 1260 | 1300 | 40 |
| 4 | TEST (WAIT) | 1260 | 1280 | 1300 | 20 |
| 5 | TEST (WAIT) | 1280 | 1300 | 1300 | 0 |
| 6 | TEST | 1300 | 1320 | | |

In step one, the test program sets a hardware resource having a settling time delay value of 80 microseconds, as indicated at 620. The start time for this step is 1200 and the end time is 1220 microseconds. The delay value of 80 is added to the end time of 1220 to get a settling time of 1300 microseconds. The remaining time is updated to the delay value of 80 microseconds. The delay value from step one is indicated at 622.

In step two, the test program sets a hardware resource having a delay value of 40 microseconds, as indicated at 624. Step two begins at 1220 and ends at 1240 microseconds. The delay value from step two, indicated at 626, extends to 1280 microseconds, which is compared to the settling time of 1300 microseconds. Since 1300 is greater than 1280, settling time is not changed. The remaining time decrements from 80 to 60 microseconds and is compared against the delay value of 40 microseconds. Since 60 is greater than 40, remaining time is not updated.

In step three, the test program calls a test function, which must wait for the delay time to elapse before performing a test, as indicated at 628. This step begins at 1240 and ends at 1260 microseconds. During this time, remaining time decrements from 60 to 40 microseconds and settling time remains at 1300 microseconds. In step four, the test system continues to wait, as indicated at 630. At the end of step four, the current time has reached 1280 and the remaining time has decremented to 20 microseconds. As indicated at 632, in step five the test system continues to wait for delay time to elapse. During this step, remaining time decrements from 20 microseconds to zero and the current time increments to 1300 microseconds. In step six, delay time has elapsed and the test is performed, as indicated at 634.

In the second example, the hardware resource delay value of 40 microseconds is transparent to the test system. The cumulative total wait time increases by 60 microseconds. The delay manager reduces a possible wait time of 120 microseconds to 60 microseconds.

Figure 11:
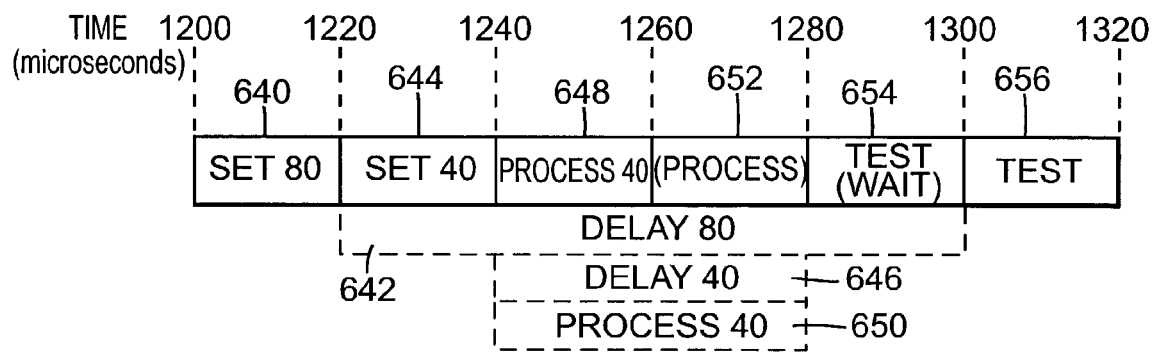
FIG. 11 is a diagram illustrating a third example of a delay management system operation.

As illustrated in FIG. 11 and detailed in Table III, the third example includes a SET 80, a SET 40 and a PROCESS 40 followed by a TEST instruction. Table III includes entries for the step number, program operation during the step, start time of the step, end time of the step, and the delay time, which is a settling time and/or a remaining time, as follows:

TABLE III

| STEP | PROGRAM OPERATION | START TIME | END TIME | DELAY TIME SETTLING TIME | DELAY TIME REMAINING TIME |
|---|---|---|---|---|---|
| 1 | SET 80 | 1200 | 1220 | 1300 | 80 |
| 2 | SET 40 | 1220 | 1240 | 1300 | 60 |
| 3 | PROCESS 40 | 1240 | 1260 | 1300 | 40 |
| 4 | (PROCESS) | 1260 | 1280 | 1300 | 20 |
| 5 | TEST (WAIT) | 1280 | 1300 | 1300 | 0 |
| 6 | TEST | 1300 | 1320 | | |

First, the test program sets a hardware resource having a delay value of 80 microseconds, as indicated at 640. This delay value is added to the end time of 1220 to get a settling time of 1300 microseconds. The remaining time is set to 80 microseconds. The delay value from step one is indicated at 642.

In step two, the test program sets a hardware resource having a delay value of 40 microseconds, as indicated at 644. This delay value is added to the end time of 1240 to get a delay time value of 1280 microseconds. This delay time value is compared to the settling time of 1300. Since 1300 is greater than 1280, settling time remains unchanged. During step two, remaining time decrements from 80 to 60 microseconds. Since the delay value of 40 is less than 60, the remaining time is not changed. The delay value from step two is indicated at 646.

Next, the test program begins to execute a process, which takes 40 microseconds, as indicated at 648 and 650. This process executes from a start time of 1240 to an end time of 1280, which is still less than the settling time of 1300. During step three, remaining time decrements from 60 to 40 microseconds. In step four, the test system is still executing the process from step three as indicated at 652. Settling time remains at 1300 and remaining time decrements from 40 to 20 microseconds.

By step five, the test program has completed the process begun in step three. Test program calls a test, which must wait for the delay time to elapse, as indicated at 654. During this step, settling time remains at 1300, remaining time decrements to zero and current time increments to 1300. As indicated at 656, in step six the test is performed, where current time has reached the settling time of 1300 and remaining time has reached zero.

In the third example, the test system executes a process that takes 40 microseconds during the required settling time of 80 microseconds. The cumulative total wait time increases by only 20 microseconds.

Figure 12:
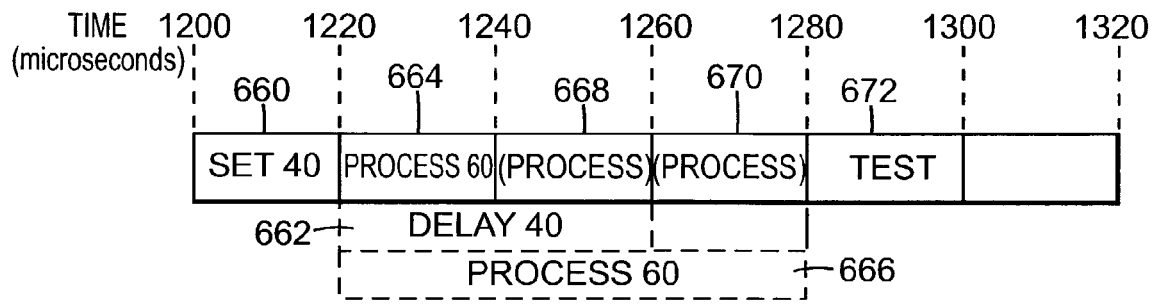
FIG. 12 is a diagram illustrating a fourth example of a delay management system operation.

As illustrated in FIG. 12 and detailed in Table IV, example four includes a test program with one SET 40 and one PROCESS 60 instruction followed by a TEST call. This example is set out in five steps with execution completed by the sixth step. Table IV includes entries for the step number, program operation during the step, start time of the step, end time of the step, and the delay time, which is a settling time and/or a remaining time, as follows:

TABLE IV

| STEP | PROGRAM OPERATION | START TIME | END TIME | DELAY TIME SETTLING TIME | DELAY TIME REMAINING TIME |
|---|---|---|---|---|---|
| 1 | SET 40 | 1200 | 1220 | 1260 | 40 |
| 2 | PROCESS 60 | 1220 | 1240 | 1260 | 20 |
| 3 | (PROCESS) | 1240 | 1260 | 1260 | 0 |
| 4 | (PROCESS) | 1260 | 1280 | | |
| 5 | TEST | 1280 | 1300 | | |
| 6 | | 1300 | 1320 | | |

As indicated at 660, the test program first sets a hardware resource having a settling time delay value of 40 microseconds. Settling time is set to 1260 microseconds and remaining time is set to 40 microseconds. The delay value is indicated at 662.

Next, the test program begins executing a process, which takes 60 microseconds to complete, as indicated at 664 and 666. This process begins at 1220 and ends at 1280 microseconds. During step two, settling time remains at 1260 and remaining time decrements from 40 to 20 microseconds. As indicated at 668, in step three, the test system continues to execute the process from step two and settling time remains at 1260. Remaining time decrements from 20 microseconds to zero and current time increments to 1260 microseconds. Delay time has elapsed by the start of step 4. In step four, the test system continues to execute the process begun in step two, as indicated at 670. As indicated at 672, in step five, the test program calls a test, which is executed immediately. In example four, the test system did not have to wait at all and cumulative total wait time is not increased.

In one embodiment, the delay manager of the present invention automatically determines one delay time, which ensures that all hardware resources set in a series of test program instructions have settled. Using this delay manger, instruction execution can continue while the hardware resources settle. The hardware resource settling time delay values can be published values from a test system manufacturer provided in an electronic file or measured values inserted into a table in an electronic file. The test engineer does not need to determine the optimum delay time for a series of hardware resource set instructions. Instead, the optimum delay time is accomplished automatically, which reduces the burden on the test engineer.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A computer system, comprising:
hardware resources having settling times and configured to perform circuit tests;
a first storage element that stores a delay time; and a delay manager configured to receive a series of settling time delay values representative of a series of the settling times for the hardware resources, respond to each settling time delay value in the series of settling time delay values by providing a corresponding delay time value, and update the delay time to the corresponding delay time value if the corresponding delay time value is greater than the delay time, where the hardware resources perform circuit tests based on expiration of the delay time.

2. The computer system of claim 1, where the delay manager is configured to decrement the delay time and the corresponding delay time value is each settling time delay value in the series of settling time delay values.

3. The computer system of claim 2, where the delay manager is configured to provide a remaining time ready signal that indicates the delay time has reached zero.

4. The computer system of claim 2, where the delay manager is configured to provide the delay time in response to an instruction to provide the remaining time.

5. The computer system of claim 1, where the delay manager is configured to accept a user supplied settling time delay value.

6. The computer system of claim 1, further comprising a timer that provides a current time, where the delay manager is configured to respond to each settling time delay value in the series of settling time delay values by retrieving a corresponding current time value, and provide a combination of each settling time delay value in the series of settling time delay values and the retrieved corresponding current time value as the corresponding delay time value.

7. The computer system of claim 6, where the delay manager is configured to provide a settling time ready signal that indicates the current time has reached the delay time.

8. The computer system of claim 6, further comprising a second storage element that stores a current start time where the delay manager is configured to update the current start time to the retrieved corresponding current time value used to update the delay time, retrieve current time values and compare the retrieved current time values to the current start time and the delay time to detect timer wrap around.

9. The computer system of claim 6, further comprising a second storage element that stores a current start time, where the delay manager is configured to update the current start time to the retrieved corresponding current time value used to update the delay time and provide a wait signal that indicates the current time is between the current start time and the delay time.

10. The computer system of claim 6, further comprising a third storage element that stores a remaining time, where the delay manager is configured to update the remaining time to each settling time delay value in the series of settling time delay values used to update the delay time, and decrement the remaining time to provide a remaining time ready signal that indicates the remaining time has reached zero.

11. The computer s system of claim 10, where the delay manager is configured to provide the remaining time in response to an instruction to provide the remaining time.

12. The computer system of claim 10, where the delay manager is configured to set the remaining time to zero in response to an instruction to set the remaining time to zero.

13. The computer system of claim 10, where the delay manager is configured to wait until the remaining time has reached zero to continue processing in response to a wait instruction.

14. The computer system of claim 10, further comprising a fourth storage element that stores a cumulative wait total, where the delay manager is configured to update the cumulative wait total to the sum of the remaining time and the cumulative wait total each time the computer system must wait to execute a circuit test.

15. The computer system of claim 14, where the delay manager is adapted to provide the cumulative wait total in response to an instruction to provide the cumulative wait total.

16. The computer system of claim 14, where the delay manager is adapted to set the cumulative wait total to zero in response to an instruction to set the cumulative wait total to zero.

17. A computer system, comprising:
hardware resources having settling times and configured to perform circuit tests;
a timer that provides a current time;
memory storing a delay time and a delay manager program that has retrieving instructions, providing instructions and updating instructions;
a processor that executes the delay manager program, wherein the processor executes the retrieving instructions to receive a series of settling time delay values representative of a series of the settling times for the hardware resources and respond to each settling time delay value in the series of settling time delay values by retrieving a corresponding current time value, where the processor executes the providing instructions to provide a corresponding delay time value that is a combination of each settling time delay value in the series of settling time delay values and the retrieved corresponding current time value, where the processor executes the updating instructions to update the delay time to the corresponding delay time value if the corresponding delay time value is greater than the delay time; and
where the hardware resources perform circuit tests based on expiration of the delay time.

18. A method for managing delays in a computer system, comprising:
receiving a series of settling time delay values representative of a series of settling times for hardware resources;
providing a corresponding delay time value in response to each settling time delay value in the series of settling time delay values;
updating a delay time stored in a storage device to the corresponding delay time value if the corresponding delay time value is greater than the delay time; and
performing circuit tests via the hardware resources based on expiration of the delay time.

19. The method of claim 18, further comprising;
retrieving a corresponding current time value from a timer in response to each settling time delay value in the series of settling time delay values;
providing a combination of each settling time delay value in the series of settling time delay values and the reprieved corresponding current time value as the corresponding delay time value; and
providing a settling time ready signal that indicates the current time has reached the delay time.

20. The method of claim 18, further comprising;
decrementing the delay time;
providing each settling time delay value in the series of settling time delay values as the corresponding delay time value; and
providing a remaining time ready signal that indicates the delay time has reached zero.

* * * * *